United States Patent
Wang et al.

[11] Patent Number: 5,216,247
[45] Date of Patent: Jun. 1, 1993

[54] OPTICAL SCANNING METHOD WITH CIRCULAR ARC SCANNING TRACES

[76] Inventors: Ying Wang; Zhijiang Wang, both of 455 E. Bonita Ave., #D-11, San Dimas, Calif. 91773

[21] Appl. No.: 832,812
[22] Filed: Feb. 7, 1992
[51] Int. Cl.$^5$ ............................................. H01J 3/14
[52] U.S. Cl. ................................. 250/236; 359/212
[58] Field of Search ............... 250/216, 234, 235, 236; 359/212, 213, 214, 215, 220

[56] References Cited

U.S. PATENT DOCUMENTS

| | | | |
|---|---|---|---|
| 3,476,948 | 11/1969 | Mengers | 359/212 |
| 3,588,218 | 6/1971 | Hunt et al. | 359/212 |
| 3,704,372 | 11/1972 | Parker et al. | 250/235 |
| 3,967,114 | 6/1976 | Cornillault | 250/236 |
| 4,301,374 | 11/1981 | Hashive | 250/236 |
| 4,413,180 | 11/1983 | Libby | 359/220 |
| 4,611,881 | 9/1986 | Schmidt et al. | 359/220 |

OTHER PUBLICATIONS

L. Beiser, Laser Focus/Electro-optics, Feb. 1985, p. 88.
H. E. R. Lassiter, Laser Focus World, Jan. 1991, p. 101.
C. W. T. Knight, Optics and Photonics News, Oct. 1990, p. 11.
D. L. White, et al., Solid State Technology, Jul. 1991, p. 37.
C. Rensch et al., Applied Optics, 28, 3754, 1989.
M. Haruna et al., Applied Optics, 26, 4587, 1987.

Primary Examiner—David C. Nelms

[57] ABSTRACT

An optical scanning method is described in which a device essentially comprises a rotational optical system S and a working plane W fed in a predetermined direction. The optical system forms the image of a stationary point A at point B on the working plane W. The image point is scanned along a circular arc by rotating the optical system around the rotational axis. In a preferred device, point A lies approximately on the rotational axis and point B lies off the rotational axis. And the circular arc generated by the scanning of point B is in the working plane approximately perpendicular to the rotational axis. A 2-dimensional scanning is completed by the rotation of the optical system around the rotational axis and the translation of the working plane in a predetermined direction, which is synchronized with the rotation of the optical system. When the radiation beam E propagates from point A to B, the device is for information writing in (e.g. lithography) and the working plane is a recording medium. When the radiation beam E propagates from the working plane to point A, the device is for information reading-out or pattern acquisition, in which a point detector is positioned right behind point A. This optical scanning method can be used in visible, UV, IR or soft x-ray waveband, providing, at the same time, large field of view, high resolution and very high data rate.

21 Claims, 15 Drawing Sheets

OPTICAL SCANNING METHOD WITH CIRCULAR ARC SCANNING TRACES

FIELD OF INVENTION

This invention relates to a new optical scanning method, specifically to devices which can be used for microlithography and mass information recording or acquisition.

BACKGROUND

Optical-scanning techniques have found important applications in many areas, for example, laser printers for computers; laser direct writing lithography for production of masks, wafers and optical integrated circuits; high speed photography; IR imaging and image information transmission, graphic-art imaging for newspapers and other printed materials; and so on.

A summary of scanning methods is presented in the articles by Leo Beiser (Laser Focus/Electro-optics, Feb. 1985) and Henry E. R. Lassiter (Laser Focus World, Jan. 1991).

Optical-scanning by X-Y stage translation can only achieve low data rate because of the low translation speed of the stage. External or internal drum scanning may obtain medium data rate, but they can only be used for exposing winding materials. As a result, high resolution can not be achieved. Polygon scanning, in which the scanning trace is a straight line, can have high data rate, but the pixels per scanning line is less than $10^5$ or even less than $10^4$ since it is difficult to obtain an imaging optical system that has large angle of view as well as high resolution.

New developments of semiconducting devices are characterized by a continual decrease in the smallest dimensions and an increase in circuit size and complexity. In today's production environment, typical pixel dimensions range from 1 to 0.7 $\mu$m. In laboratories, devices with structure sizes in the order of 0.5 $\mu$m have been realized. In the 1990s, structures smaller than 0.5 $\mu$m will be needed, e.g., for the production of 16 Mbit memory chips. The decrease in structural dimension not only permits a higher circuit complexity, but also an increase in speed and a decrease in power consumption, which is just as important.

The field of view of the objective in current projection lithographic stepper is smaller than 20 mm×20 mm. The linewidth d is determined by the wavelength used ($\lambda$) and the quality of design and fabrication of the imaging system:

$$d = \frac{K \cdot \lambda}{NA}$$

where K is about 0.5 to 0.9, determined by the quality of the image and NA is the numerical aperture of the objective which is normally smaller than 0.5. Because the depth of focus is inversely proportional to $NA^2$, the optical system becomes difficult to use when NA is too large.

When a laser is used as the light source, the wavelength ($\lambda$) may be shorter than 0.16 $\mu$m. However, it is difficult to obtain an objective with a large field of view as well as a high resolution in extra UV wavelength due to the lack of appropriate optical material. C. W. T. Knight has recently reviewed some of these problems associated with future optical microlithography (Optics and Photonics News, Oct., 1990).

By using laser plasma, synchrotron x-ray sources or x-ray free electron laser, wavelength could be considerably shortened. Recently the development of soft x-ray multilayer coating has made soft x-ray projection lithography possible (D. L. White, et al., Solid State technology, July 1991, p37). In the past, soft x-ray was suggested for proximity lithography or projection lithography to improve system resolution and shrink structure sizes of integrated circuits. But, mask fabrication is very difficult and unstable. Moreover, soft x-ray projection systems can not achieve large area exposure. It is difficult to design a projection objective with large field of view and high resolution. Another problem is making a UV or soft x-ray optical system with a field of view larger than 20 mm and a pixel dimension smaller than 0.3 $\mu$m, which is very important to the integrated circuit industry.

Recently laser raster scanning technique has been introduced for the production of masks and wafers with a resolution better than 1 $\mu$m (M. Haruna et al, Applied Optics, 1987, v.26, p4587; C. Ransch et al, Applied Optics, 1989, v.28, p3754). As a direct writing lithographic method, it uses microscope objective with high resolution and small field of view, but writing speed is very slow.

Rotational scanning on planar surface on which the image spot is always focused has not become practical or useful for high speed and high resolution applications. A few rotational scanning devices are described in prior art patents: U.S. Pat. Nos. 3,588,218, 4,301,374, 3,704,372, 3,476,948, 4,413,180, 4,611,881. U.S. Pat. No. 3,746,948 discloses a room protection apparatus. U.S. Pat. No. 4,413,180 describes a robot vision system. Both devices are not imaging system and can not provide precise information of a surface during rotational scanning. U.S. Pat. No. 3,704,372 shows a rotary scan line-/edge tracer using a motor driven mirror to produce the rotational scanning. There are a few problems for this device. The photocell detector is mounted adjacent the center of the stationary focusing lens which caused the loss of the light power and reduced the aperture of the lens. Furthermore, the stationary focusing lens after the rotational mirror greatly limits the field of scanning. The system can not be modified to be a recording system (e.g. for lithography) by replacing the photocell with a light source. U.S. Pat. Nos. 3,588,218, 4,301,374 and 4,611,881 describe rotational scanning devices for continuous scan in which one of the spots always scans the recording medium at any one instance. The scanner in U.S. Pat. No. 3,588,218 by Hunt et al uses an optical system with multi-focus spots which is sophisticated and technically difficult to build. To the skilled in the art, it is well known that the more complicated the optical system, the more stray light will be generated and the signal noise ratio will be decreased. Since all the spots, the image plane (the recording medium), and the planar mirror are in the same plane in the scanner, only flexible or soft recording medium can be used and because flexible recording medium such as a tape can not be made very planer, high resolution can not be achieved with such device. Moreover, because all spots are formed through different light paths which have different number of optical component, the brightness of each spot is different due to the sequential and inherent loss in light transmission and the quality of both recording and readout of data will be poor. Such difference in spot brightness will become especially significant when x-ray is used as the light source. Because the reflectivity of x-ray on the best mirror can be only about 60%, it can not be used as a light source in such devices. Schmidt (U.S. Pat. No. 4,611,881) discloses an optical apparatus for scanning radiation over a surface. A complex turnable structure with separated remote reflectors and central reflector is used. The central reflector needs to accelerate and decelerate repeatedly, which is impossible for high speed scanning required in the present art. Hashiue (U.S. Pat. No. 4,301,374) reveals an optical multi-lens scanner which is similar to some devices cited in that patent. For a four lens scanner, light source has to illuminate the entire active quarter of scanner and different part of light is allowed to pass a lens during scanning. As a result, most of the light power is wasted and this in turn greatly limits the speed of scanning because of the low exposure. The necessity of using a 50/50 mirror further impairs the light power. Moreover such illumination will cause stray light and decrease the image quality, even a shutter is used. In addition, in Hashiue's devices, the beam axis from the scanner to the detector system does not remain fixed during the scanning and the entrant direction of the light beam from the scanner to the detector changes with the rotation of the scanner. It is well known that the sensitivity of a detector is different for light coming from different direction and hence the performance of the detector in these devices will be greatly limited.

OBJECTS AND ADVANTAGES

This invention introduces a new optical scanning technique. It can be applied to the various disciplines described above, and preferably to imaging techniques using extra-ultraviolet and soft x-ray wavebands, where a resolution better than 0.3 $\mu$m or even a resolution of several hundred Angstroms are possible. This new technique also permits a large area to be scanned. Moreover, this new optical scanning technique can achieve a high data rate which is over $10^9$ pixels per second. Further objects and advantages of this new technique are to provide new methods used in pattern or data scanning acquisition with equally high data rate and high resolution, simply by reversing the direction of light propagation. Still further objects and advantages will become apparent from a consideration of the ensuing description and drawings.

BRIEF DESCRIPTION OF THE FIGURES

These and other objects and features of the present invention will become apparent from following description with reference to the accompanying drawings, in which.

GENERAL DESCRIPTION OF THE INVENTION

Figure 1:
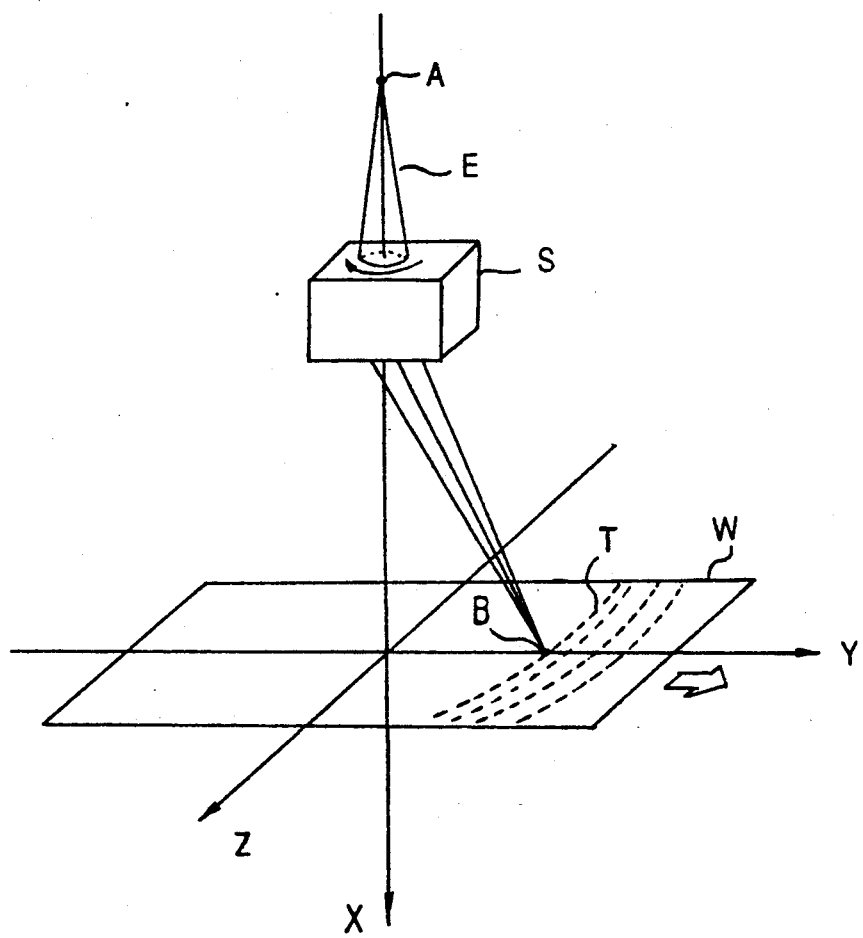
FIG. 1 shows a general principle of the rotational scanning system, in which radiation beam propagates either from point A to B or B to A.

FIG. 1 shows the general principle of our scanning system. The optical system S in the figure is an arbitrary optical system which can be simply a mirror, a prism, a lens, a holographic element or a plurality of optical components. In this new optical scanning method, a device essentially comprises a rotational optical system S and a working plane W fed in a predetermined direction as shown in FIG. 1. The optical system S forms the image of a stationary point A at point B. The image point is scanned along a circular arc by rotating the optical system S around the rotational axis, so the scanning traces T are circular arcs. In a preferred device, point A lies approximately on the rotational axis and point B lies off the rotational axis. The circular arc generated by the scanning of point B is in the working plane W approximately perpendicular to the rotational axis. A 2-dimensional scanning is completed by the rotation of the optical system around the rotational axis and the translation of the working plane in one direction. The translation is synchronized with the rotation of the optical system. When radiation beam E propagates from point A to B, the device is for information writing-in (e.g. lithography) and the working plane is the surface of a recording medium (see below). When radiation beam E propagates from the working plane to point A, the device is for information reading-out or pattern acquisition, in which a point detector is positioned right-behind point A and the working plane is the surface of a pattern (see below). This optical scanning method can be used in visible, UV, IR or soft x-ray waveband, providing, at the same time, large field of view, high resolution and very high data rate.

Figure 2:
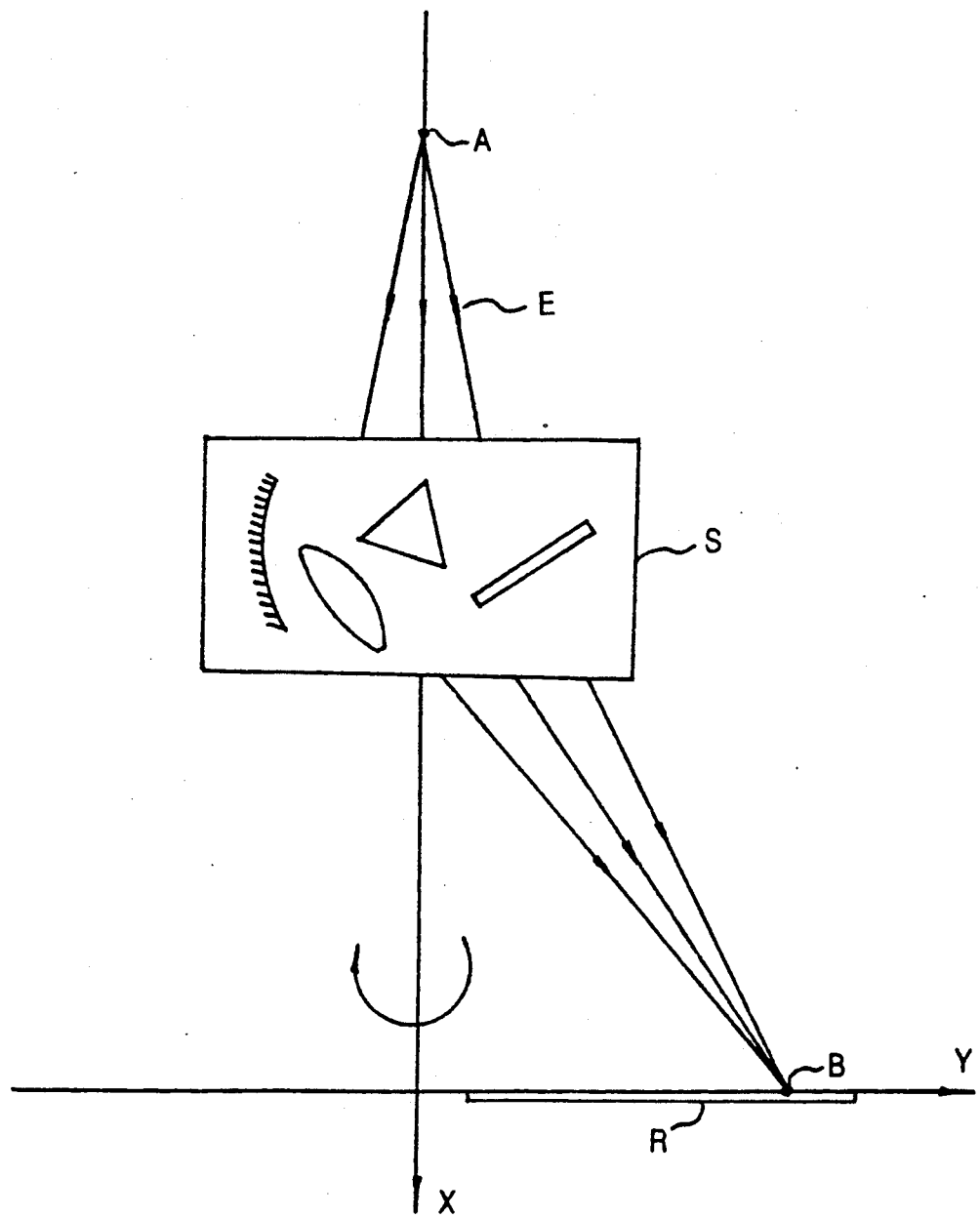
FIG. 2 shows a rotational scanning writing system in which an arbitrary optical system S forms the image of point A at point B and scanning is achieved when S rotates around the X axis writing information along a circular arc in the Y-Z plane on the recording material R which translates along the Y axis allowing a 2-dimensional pattern to be recorded.

In FIG. 2, a rotational scanning system for writing-in is shown. Radiation beam E propagates from point object A to the recording medium R. The working plane of R coincides with the Y-Z plane. The recording medium can be a wafer coated with a photoresist. As a completely new optical scanning technique, this invention comprises scanning by high speed rotation of a image spot B on the working plane (Y-Z plane) or R, with R translating in one direction to complete the scanning of an area. The Z axis is perpendicular to X and Y axes and points from paper towards the reader (not shown, same below). The spot B is the image of a stationary point object A, and the image spot B is moved by rotating the optical system S around the X axis.

Figure 4:
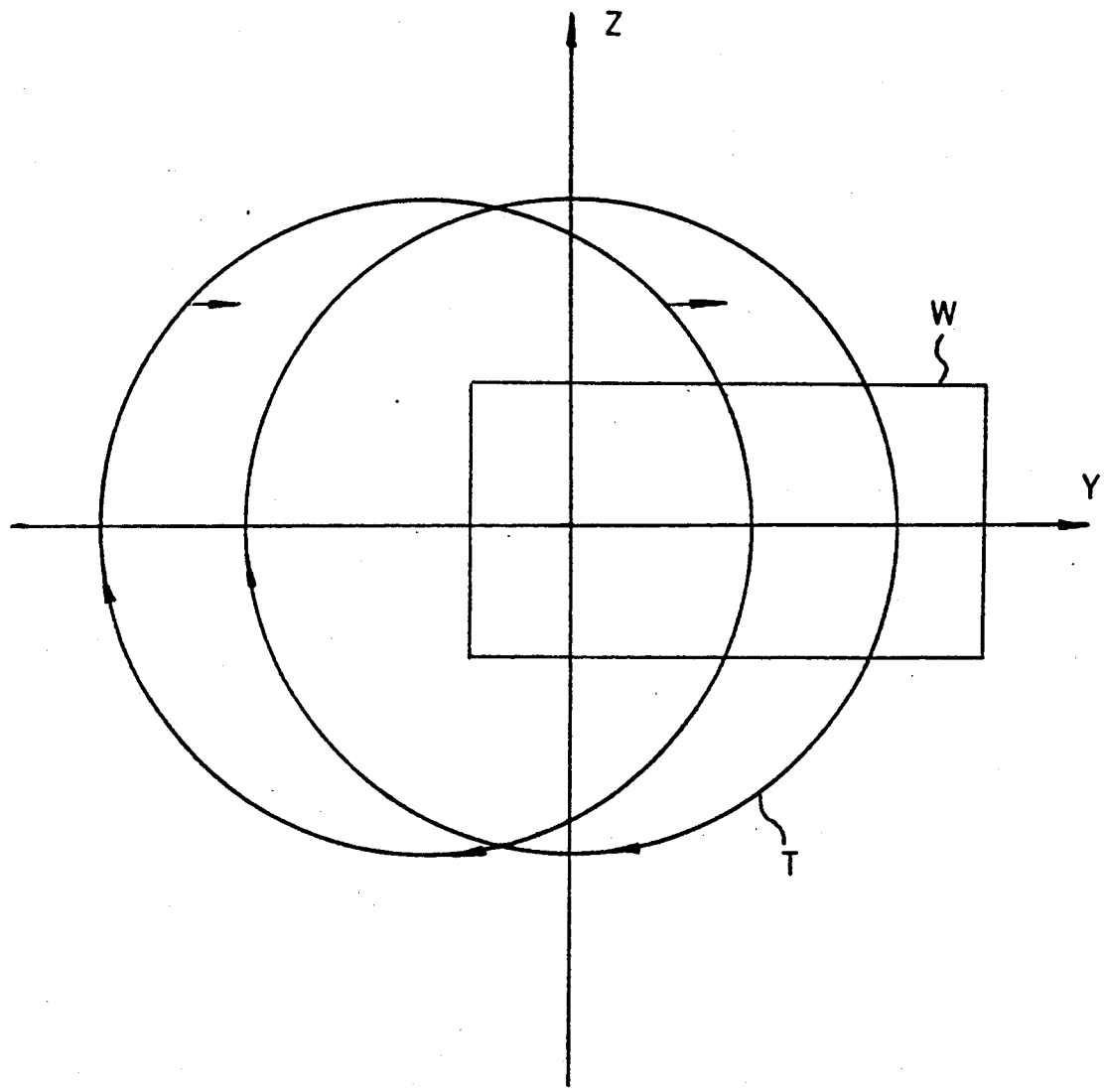
FIG. 4 shows the scanning traces caused by the rotation of the optics and the translation of the working plane.

The optical system S forms an image of point object A at point B, where A lies on the rotational axis and B lies off the rotational axis as shown in FIG. 2. The image point is scanned along a circular arc by rotating the optical system S around the axis X. The circular arc generated by point B is in the Y-Z plane perpendicular to the rotational axis. The optical system, and point object A can be located anywhere as long as the optical path from point object A to image B is not blocked and the plane is allowed to translate freely. FIG. 4 shows two scanning traces caused by the rotation of the optical system and translation of the recording medium in the Y-Z plane.

The translation of the working plane Y-Z is synchronized with the rotation of the optical system. The translated distance of the plane in the time of one rotation circle is just equal to the diameter of the image spot B formed by the optical system S. This diameter is also the linewidth or minimum feature size that can be obtained by the whole system. The minimum diameter of the image spot is determined by diffraction.

The point object can be a point radiation source. It may be a pinhole illuminated by some radiation source or it may also be a image of some radiation source if the image spot of the radiation source is small enough to achieve desired minimum feature size. Generally speaking, by means of some transformation device a radiation source can be transformed into a point radiation source. The point radiation source may also be some small radiation source, such as a diode laser. A variety of radiation sources can be used including laser and synchrotron x-ray radiation source, etc. If the brightness of the point object is modulated properly, a pattern can be written over a large 2-dimensional area by this scanning technique.

Figure 5:
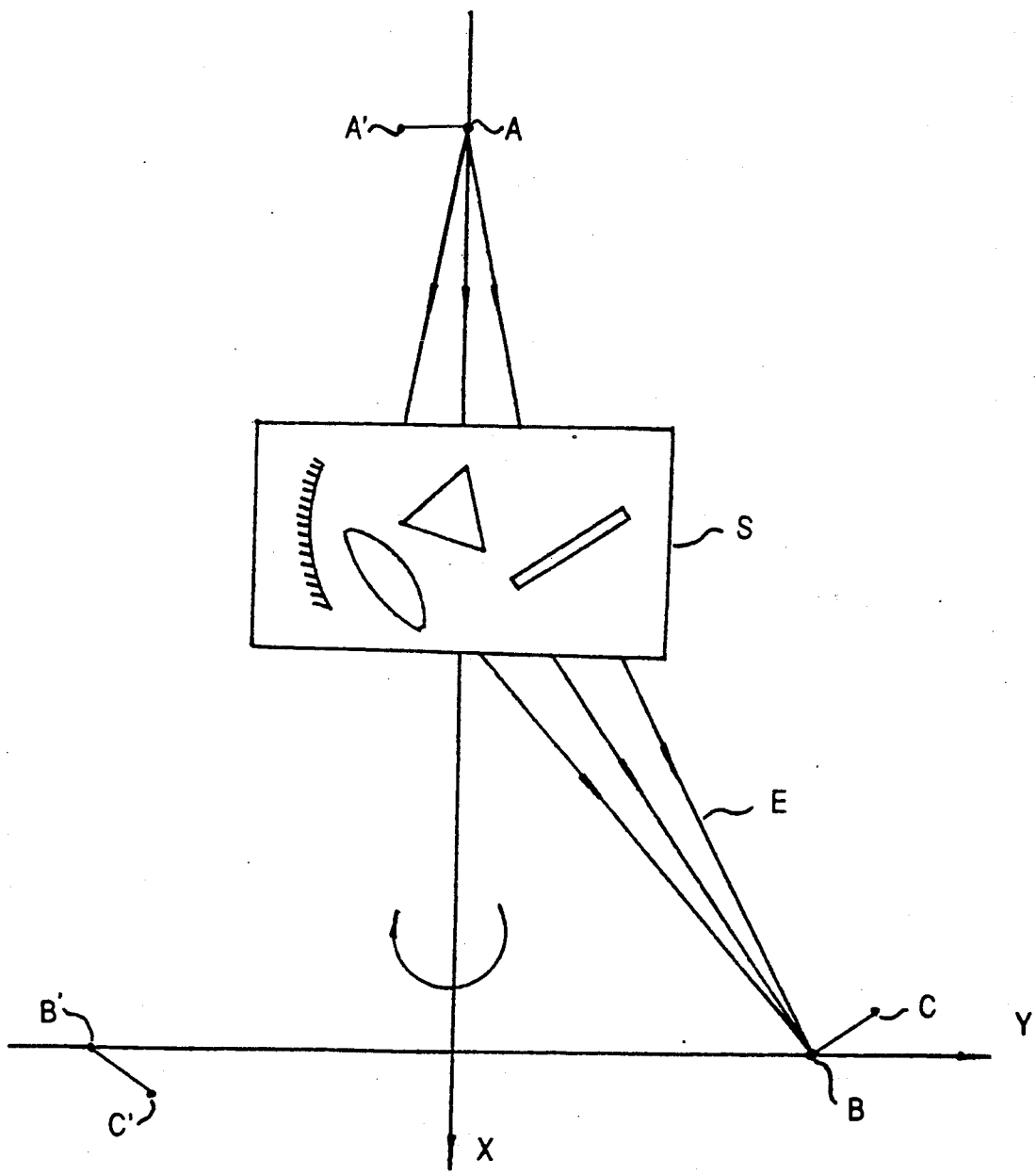
FIG. 5 shows a rotational scanning system in which point object A' is not on the rotation axis and the rotation trace of point C is in a plane other than the Y-Z plane.

When point object A is moved off the X axis to point object A'(as shown in FIG. 5), the optical system S forms the image of A' at C. When the optical system S rotates by 180° around the X axis, the image of A' is at C'. Both C and C' lie outside the Y-Z plane which is perpendicular to the rotation axis as shown in FIG. 5. In fact, it is obvious that since the image of A is located in the Y-Z plane, e.g. at point B and B', the scanning image trace of A' will be in another plane other than the Y-Z plane.

However, when the distance between A and A' is very small, although the image of point A' (e.g. C in FIG. 5) is defocused from the Y-Z plane (i.e. the working plane), the image spot formed on the plane is still very small and still smaller than the minimum feature size required. Therefore, it becomes possible to carry out the scanning simultaneously with two or more point radiation sources or with a point radiation source array. Each point radiation sources are modulated individually. The writing-in data rate, therefore, can be increased for several times than in the case of a single point source. Apparently only one section of the scanning arcs can be used in this multi-point-source scanning. In this kind of scanning, a plurality of independent point radiation sources can be used or a beam dividing device can be used for dividing a radiation source into a plurality of sources.

Besides pattern generation described above, the new scanning system provided by this invention can also be used for pattern acquisition. This is accomplished simply by reversing the direction of light propagation as shown in FIG. 3.

Figure 3:
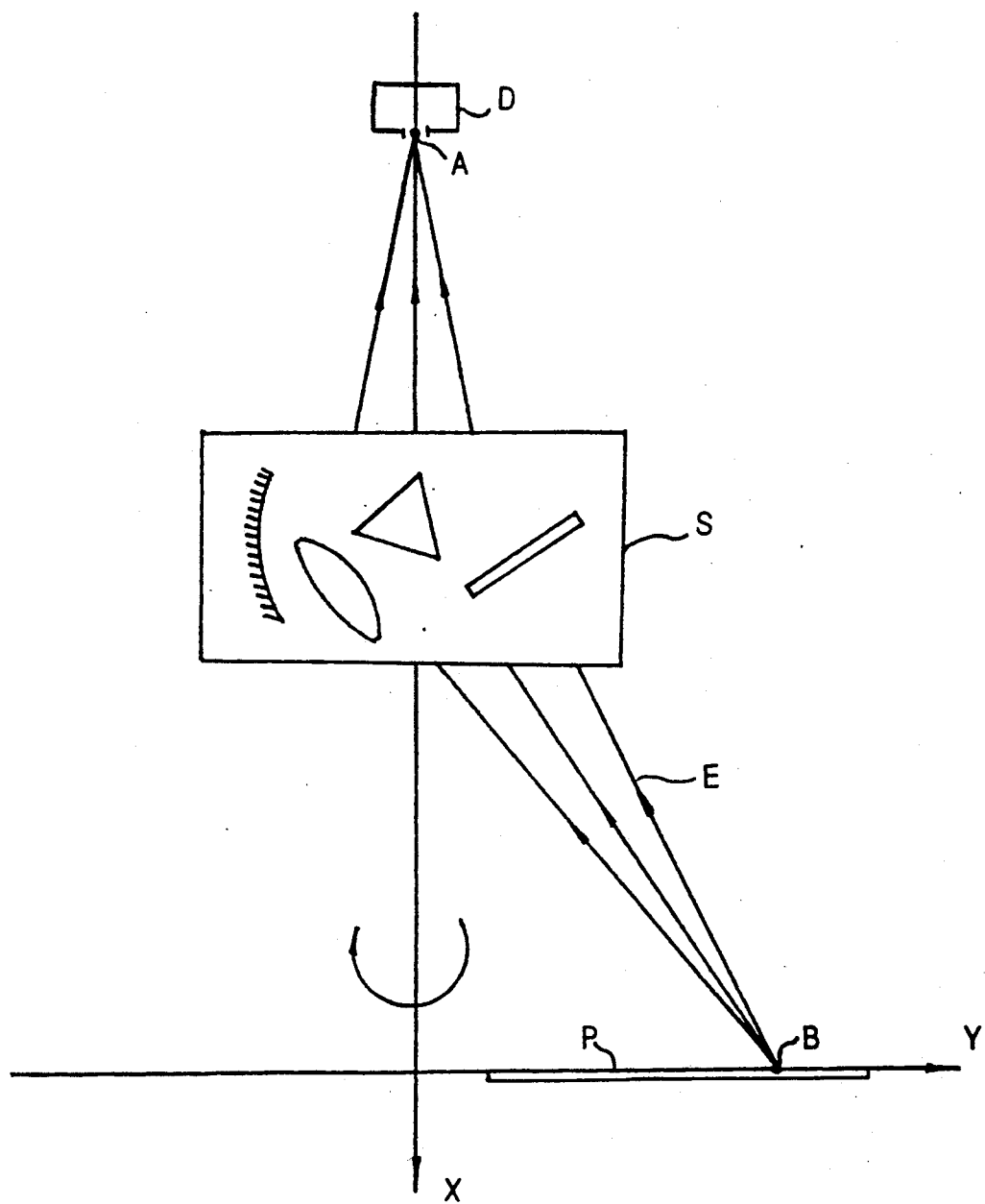
FIG. 3 shows a pattern acquisition system in which an arbitrary optical system S rotates around the X axis and a pattern P translates in Y direction.

In FIG. 3, D is a point detector system, P is a pattern plane lying in the Y-Z plane which is perpendicular to the rotational axis. S is an arbitrary optical system rotating around the X axis as described above. P is illuminated by a radiation source. The combination of translation of the pattern and high speed rotation of the optical system S allows the entire pattern to be scanned. Radiation beam E propagates from the pattern plane P to the point detector system D. The point detector system D is positioned on the rotational axis just behind point A and only receives the signal from point A. The point detector system can be a simple point radiation detector or a combination of a transformation means and a radiation detector. The function of the transformation means is to allow only the radiation from a single point to be received by the radiation detector. A simple example of the transformation means is a pinhole, which only allow the radiation that passes through the pinhole to reach the radiation detector. In FIG. 3, the arbitrary optical system S forms the image of a point B in the pattern plane at point A and, optically speaking, B is also the image of A. The dimension of the image spot of the point detector is the minimum feature size of pattern that can be obtained by the whole system.

During pattern acquisition, the optical system S forms an image of the pattern on the point detector system. Pattern acquisition is achieved by rotating the optical system around the X axis to form a circular scanning trace on the pattern plane which translates along the Y axis to obtain a complete 2-dimensional scan.

Translation of the working plane Y-Z is synchronized with rotation of the optical system. The translated distance of the plane in the time of one rotation circle is just equal to the diameter of the image spot of point detector system.

In pattern acquisition, the point detector system can be an array of point detectors (such as a linear CCD) or a plurality of independent point detectors. In this case, a multipoint scanning can be achieved and a much higher data rate than in single point scanning can be obtained.

When the pattern plane is not in the Y-Z plane (i.e. not perpendicular to the rotational axis of the optical system S), the image of the circular scanning trace is not locate on the rotational axis. Therefore if a point detector is used, it must not lie on the X axis.

Description of Preferred Embodiments

Figure 6:
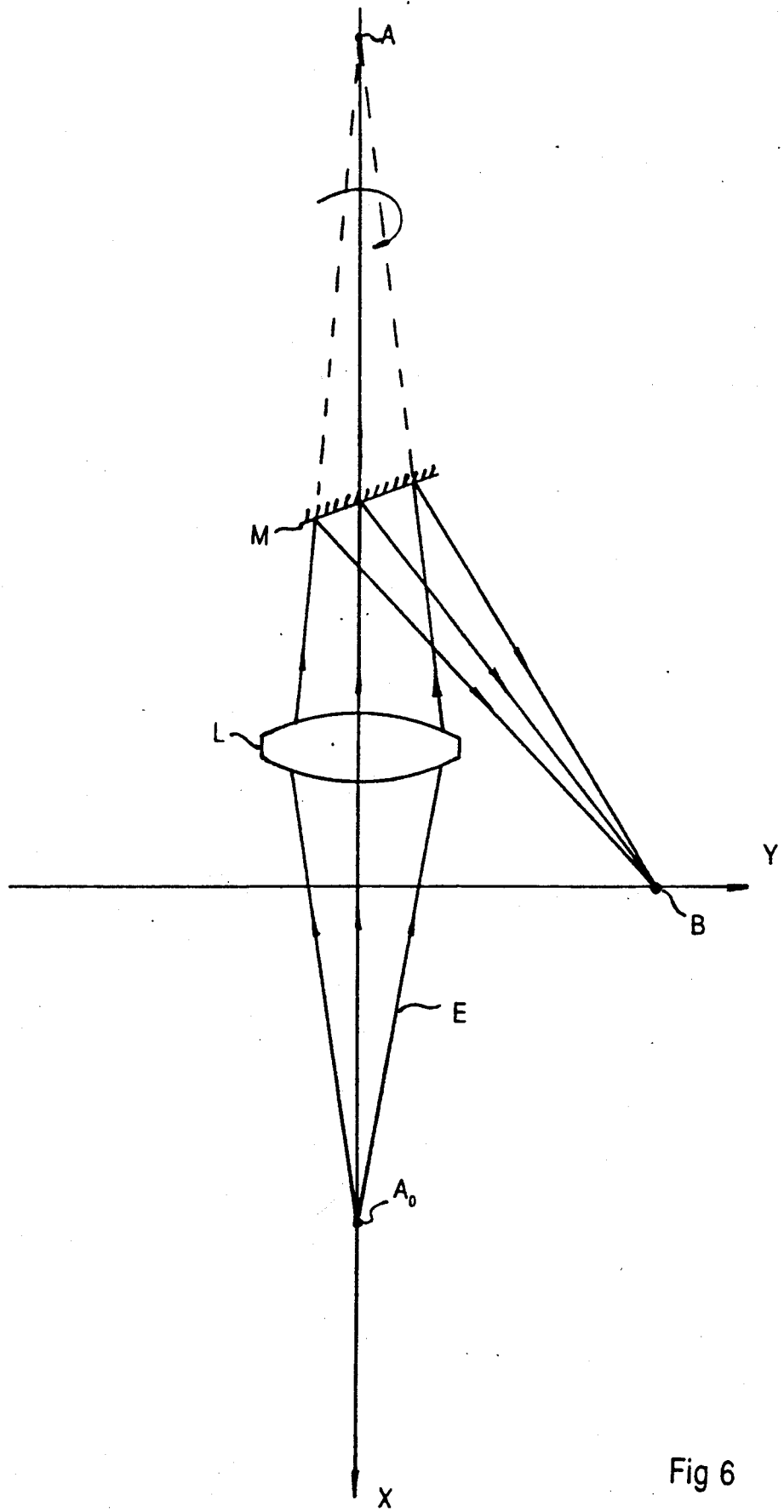
FIG. 6 shows a scanning system where the scanning is performed by the rotation of a single planar mirror.

An embodiment of a scanning device is given in FIG. 6. The point object $A_0$ is imaged into spot B by lens L and plane mirror M. Point A is the image of the point object $A_0$ formed by lens L. Point A is on the rotational axis. When M rotates around the X axis, point B will scan out a circle on the Y-Z plane. In this example, planar mirror M represents the optical system described in last section (General Description). The lens L can be any axially symmetrical or non axially symmetrical lens or a plurality of lenses.

Figure 7:
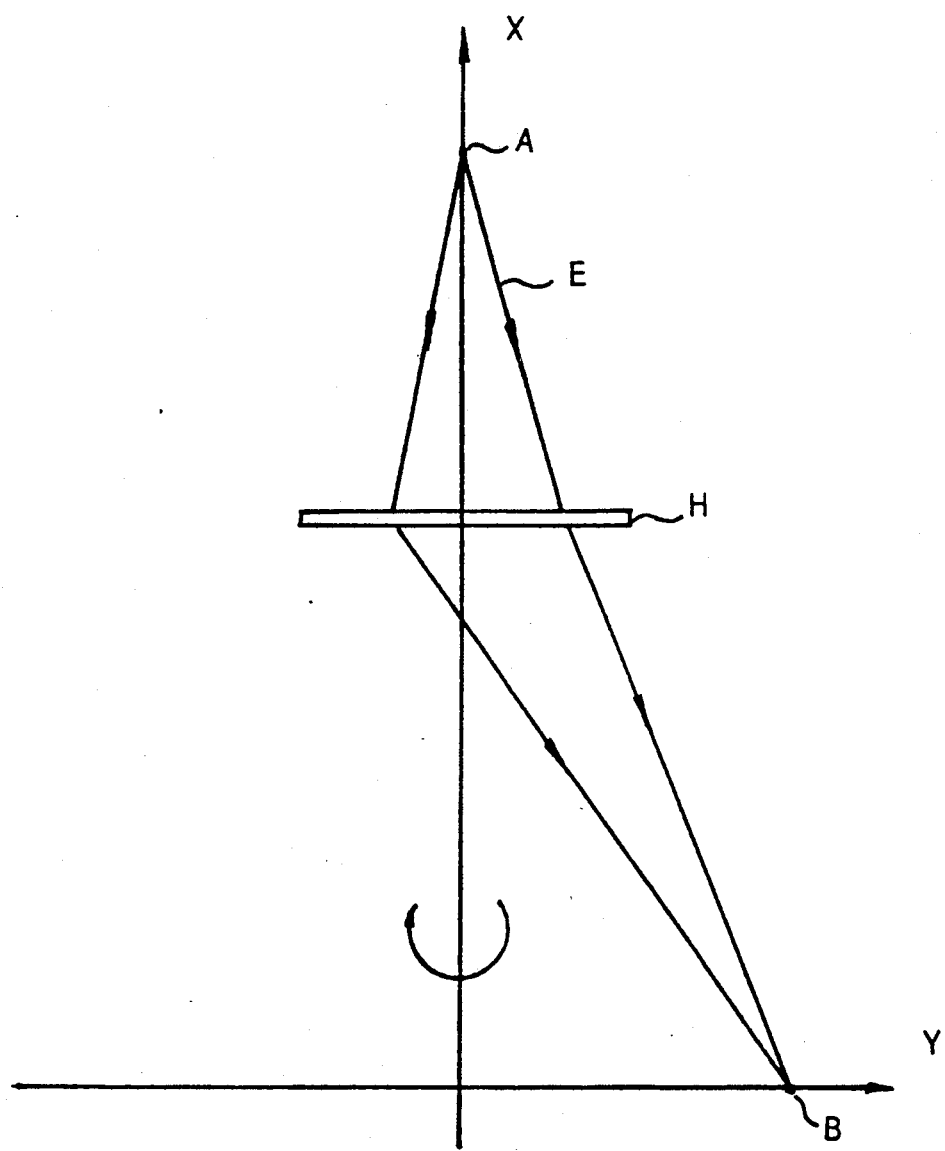
FIG. 7 shows a scanning system where the scanning is performed by the rotation of a holographic element H.

FIG. 7 shows another embodiment. The optical system here is a holographic plate H rotating around the X axis. The holographic plate H forms the image of point A at point B. Of course, holographic imaging requires a monochromatic radiation source.

Figure 8:
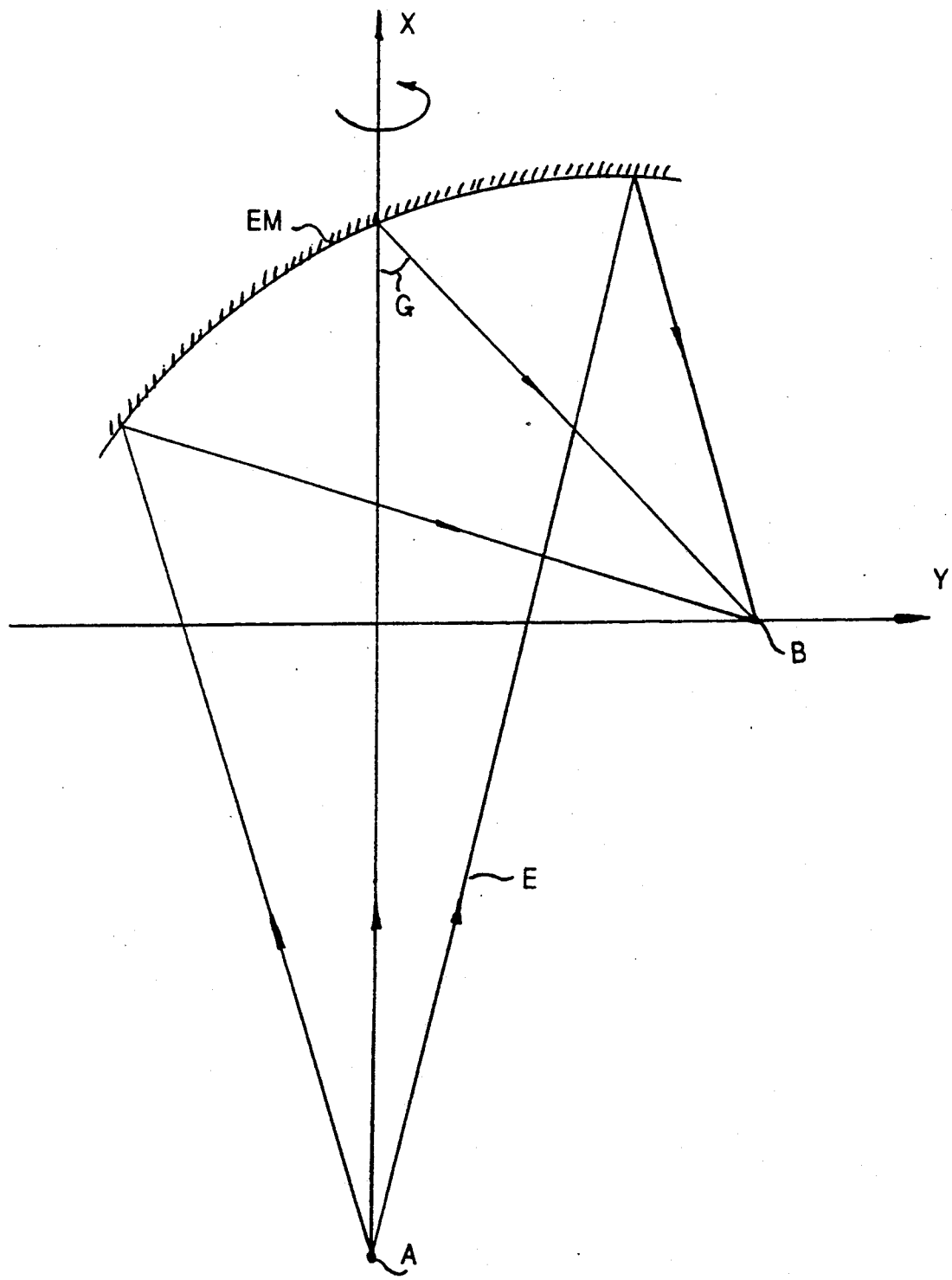
FIG. 8 shows a scanning system where the scanning is performed by the rotation of a single ellipsoid mirror.

FIG. 8 shows another embodiment. The optical system here is an ellipsoid mirror EM rotating around the X axis. Two focuses of the ellipsoid are at A (point object) and B (image spot), so B is the perfect image of A.

Figure 9:
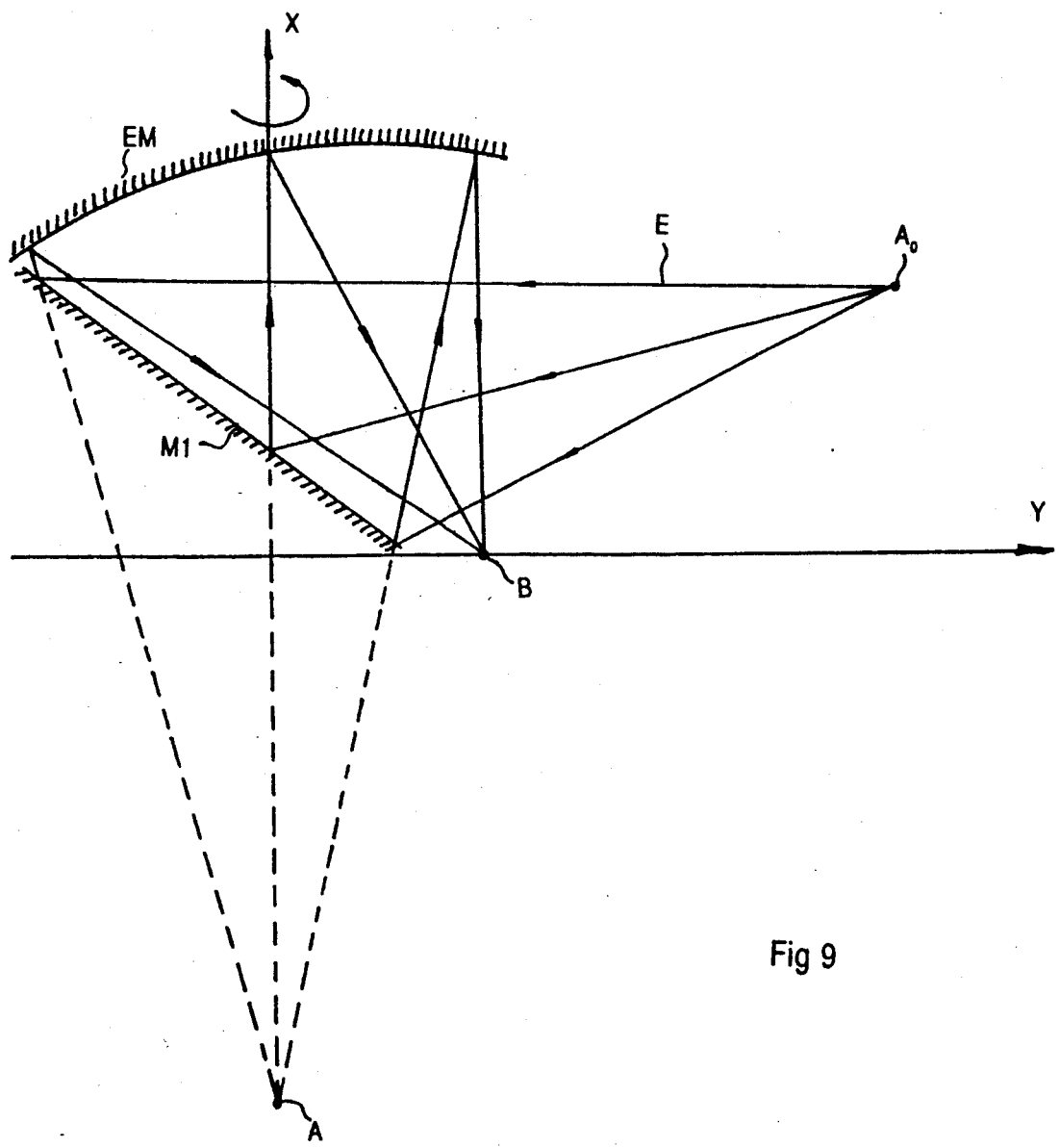
FIG. 9 shows a laser or x-ray lithography system using a single rotating ellipsoid mirror.

FIG. 8 illustrates an embodiment of the rotational scanning technique used for direct writing UV lithography, in which the optical system is an ellipsoid mirror with NA=0.5 at point B (beam angle 60°). When the distance from B to the rotational axis (i.e. scanning radius) is 80 mm, a 6 inch wafer can be exposed by rotating the optical system and translating the wafer. In FIG. 8, angle G is 45°. The larger the angle G, the smaller the size of the mirror. This angle, however, can not be too large, since the mirror will touch the working plane Y-Z. In FIG. 8, the radiation beam from A has to pass through the Y-Z plane to reach the mirror. In some case, this may limit the movement of the recording medium. To avoid this, a stationary planar mirror M1 is added to reflect radiation beam, as shown in FIG. 9. The rotational ellipsoid mirror EM further forms the image on the Y-Z plane. Now $A_0$ is a point object (e.g. a pinhole), while its image A is still on the rotational axis. If the NA is smaller than 0.5, it will be easier to implement because the size of the mirror will be correspondingly smaller, but the linewidth will become larger. If the small hole $A_0$ is illuminated by a continuous ultraviolet laser beam, a very narrow linewidth will be achieved if the NA is large enough. For instance, using second harmonics of an $Ar^+$ laser of wavelength 0.229 $\mu$m and an NA of 0.5, the linewidth will be smaller than 0.3 $\mu$m. If a laser with an even shorter wavelength is used, a linewidth smaller than 0.2 $\mu$m can be obtained. The modulation of the laser beam has to be synchronized with the scanning. The synchronizing signal can be generated by pre-engraving lines on the wafer. The speed with which the mirror rotates around the rotational axis has its limit. If the speed is too high, the mirror will be broken by the centrifugal force. Some metal mirror can tolerate a linear edge speed of 500 m/sec. If the diameter of the mirror is 150 mm, the allowed speed will be $6 \times 10^4$ rpm. The scanning will take 8 min for a 6 inch wafer if the spacing between each scanned circle is 0.3 $\mu$m. That is, 7 wafers can be exposed in an hour. Since the trace of the light point can expose two neighboring wafers at the same time, 14 wafers can be processed in one hour. The write speed is higher than $10^9$ pixels/sec. Because the mirror surface may deform due to the centrifugal force, the deformed mirror surface should be an ideal ellipsoid configuration during high speed rotation. As shown in FIG. 8, the axis of the ellipsoid is the line connecting A and B, which are the two focuses of an ellipse. When the scanning radius and mirror diameter are reduced in size proportionally, for example to ½ of the original size, the rotation speed can be two-fold higher. Although the time needed for scanning a 6 inch length will be reduced by half, two scans are required for each 6 inch wafer. Therefore the required exposure time is still the same.

This new laser scanning technique can be used in the production of masks. It can also be used in the production of wafers, especially in the manufacture of application specific integrated circuits (ASICs) with feature size about 0.3 $\mu$m without using masks.

This new laser scanning technique can be used to produce circuits with a feature size of about 0.3 $\mu$m and area ranging from less than 20 mm×20 mm to larger than 100 mm×100 mm. This resolution and image field of view are impossible for the existing microlithographic techniques. In some cases, optical integrated circuits with dimensions longer than 20 mm are desired and can be manufactured by this technique.

Point object A (or $A_0$) in FIGS. 2, 6, 7, 8 and FIG. 9 or in other embodiments of this invention is realized by a pinhole illuminated with a radiation source. It can also be realized by focusing a laser beam or synchrotron radiation. If the focused spot is small enough to achieve desired minimum feature size, the pinhole may not be necessary.

The scanning system shown in FIG. 9 is an embodiment of soft x-ray direct writing lithography system. Soft x-ray permits the use of reflective optical components. By applying x-ray at wavelength about 140 Å as the radiation source, the normal incidence reflectivity of the multilayer coatings is up to about 60%. When the incident angle is about 45°, the reflectivity is even higher.

Synchrotron radiation between 50-200 Å can be used as a soft x-ray source. This radiation is focused on the small hole of diameter of 10 $\mu$m. The elliopsoid mirror can reduce the hole image diameter by 200 times to form a image of 0.05 $\mu$m. The NA needed is between 0.05-0.2. When the scanning radius is 100 mm, the diameter of the mirror is about 28 mm.

The modulation of the synchrotron x-ray or x-ray free electron laser can be realized by modulating the electron beam current. Because the reflectivity of multilayer coatings are different for s and p polarization, the transmittance of the two mirror system varies with the ellipsoid mirror rotation, and can be compensated by electron current modulation.

This soft x-ray direct writing lithography system can realize lithographic linewidth of less than 0.05 $\mu$m on a 6 inch wafer. It is also applicable to wafers with a diameter larger than 10 inch.

The scanning system described above is only one embodiment of the soft x-ray direct writing lithographic methods. Any scanning system that can be used with soft x-ray can be used for soft x-ray lithographic system.

Figure 10:
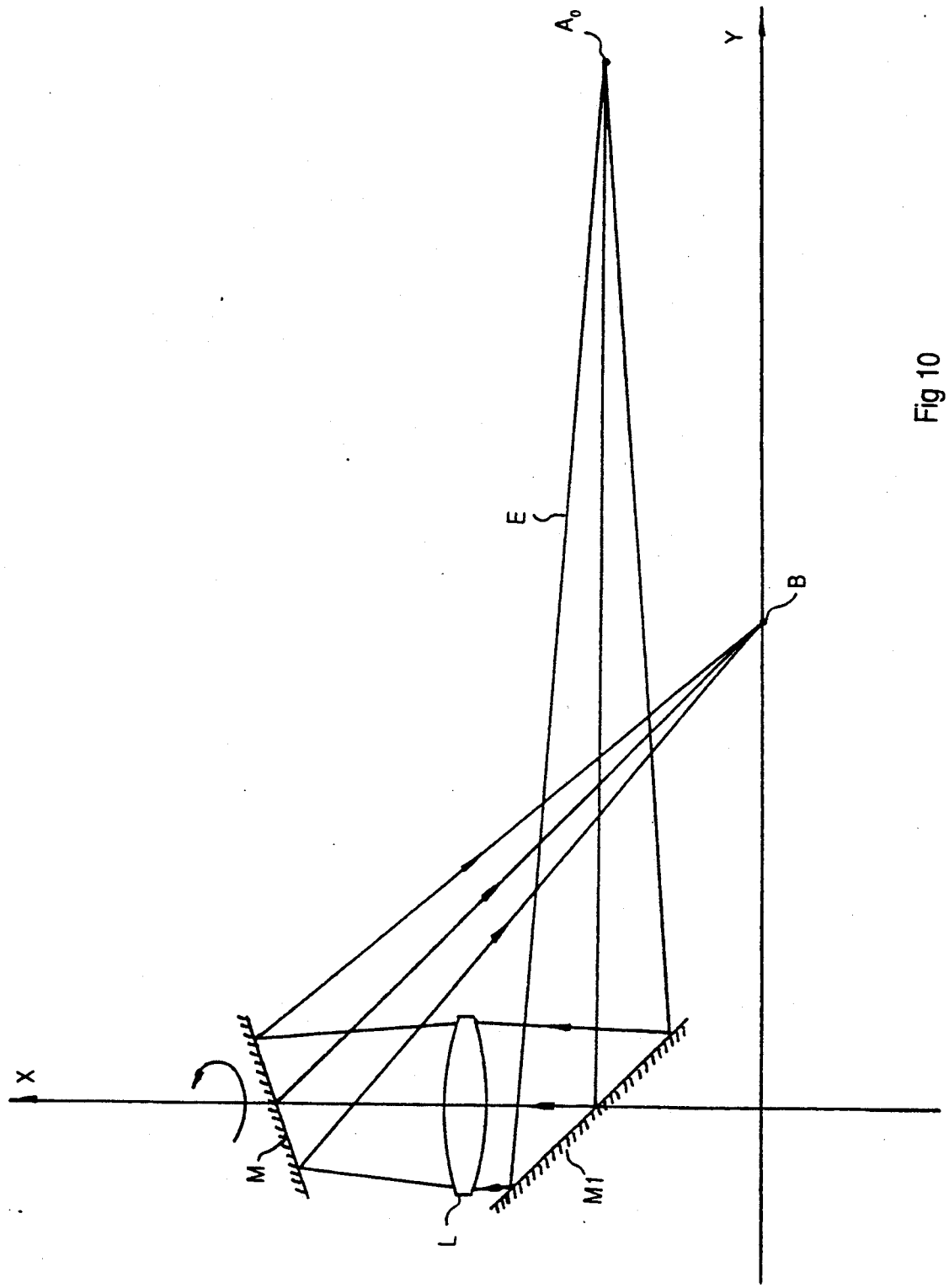
FIG. 10 shows a low cost rotational scanning system using a rotating planar mirror.

Another embodiment of this new technique is in the application in graphic-arts imaging, which can also be illustrated with FIG. 9. If extra UV or x-ray are not used, a spherical lens system may be used for its low cost (FIG. 10). M1 is a stationary plane mirror. L represents a stationary lens or a plurality of lenses. M1 and L form the image of point light source $A_0$ on the rotational axis X. The mirror M, that rotates around the X axis, then forms the image at B. Graphic arts normally do not require high resolution, and text or line art are generally satisfactory at about 1000 line per inch. This figure can be increased to 4200 line per inch for situation in which users of the printed material want a perceived increase in the sharpness of the picture. This can be realized by an optical system with a numerical aperture greater than 0.02 or 0.08, using a 4880 Å line $Ar^+$ laser light source. Two examples is shown in Table 1.

TABLE 1

| resolution (line/inch) | 1000 | 4200 |
|---|---|---|
| numerical aperture, NA | 0.02 | 0.08 |

TABLE 1-continued

| | | |
|---|---|---|
| scanning radius, (mm) | 200 | 100 |
| mirror diameter, (mm) | 11 | 23 |
| rotation speed, × $10^4$ (rpm) | 3 | 4 |
| scanning speed, (ft²/min) | 3 | 0.5 |

From these examples, it can be seen that this invention can provide a high quality and low cost system for graphic arts.

According to the principle described above, this invention can provide data rates higher than $10^9$ pixels/sec. That is, the time resolution may be up to $10^{-9}$ sec for high speed photography. When used as streak camera, comparing with the current methods, the scanning technique described in this invention can wait longer, does not require precise synchronism and can be used at soft x-ray wavelength. Moreover the time resolution of this soft x-ray streak camera may be better than $10^{-10}$ seconds.

Figure 11:
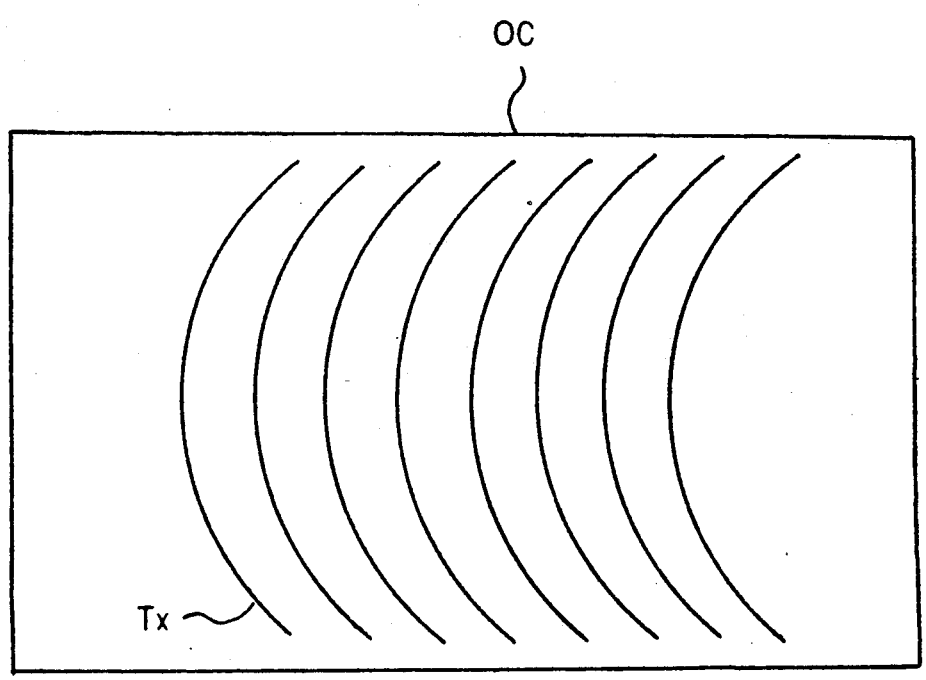
FIG. 11 shows an example of an optical card with scanning traces.

Also by the same principle described above, this invention is applicable to information memory, with an information density greater than $10^{11}$ pixels per frame and a data rate exceeding $10^9$ pixels per second. The input information can be memorized by rotational scanning writing on a recording medium (optical card). As an optical memory method, this invention has advantages over current optical discs. In current optical disc system, such as audio CD, high speed scanning is performed by rotating the disc, which is much slower than rotating an optical component such as a mirror. It is well known that low data rate is the major drawback of optical discs for high speed computers. This invention, therefore, provides a new optical memory system. FIG. 11 shows an optical card OC with circular arc-like memory traces $T_x$. Of course, during the information writing-in or reading-out, the scanning traces must coincide with these memory traces. The high data rates provided by this scanning technique is more compatible to a high speed computer.

The quality of computer generated holography (CGH) is determined by the total pixel number of the CGH. This invention can furnish a density of at least $10^{11}$ pixels per frame, and therefore can provide high quality CGH.

Figure 12:
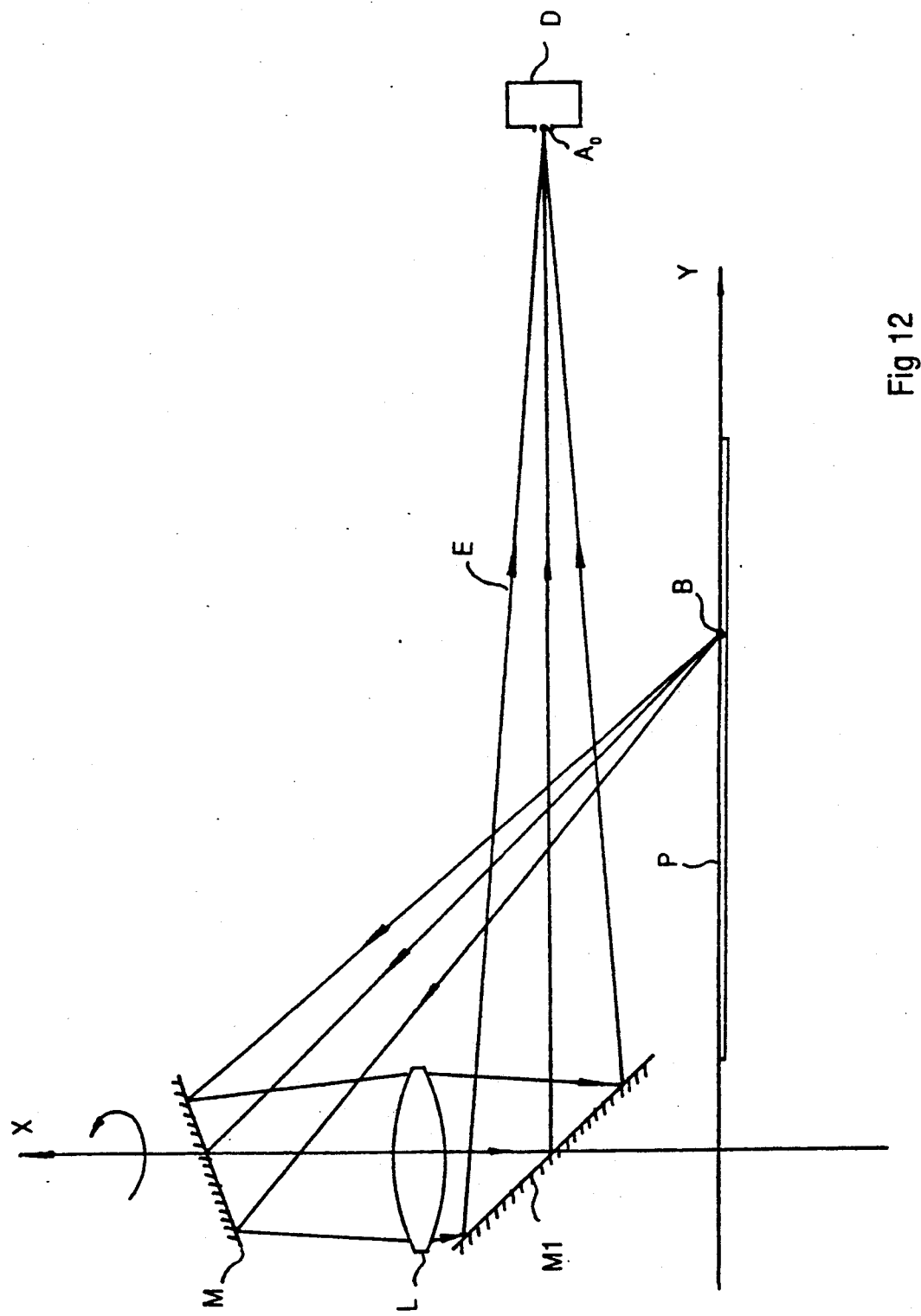
FIG. 12 shows a rotational planar mirror pattern acquisition system.

Still another embodiment is pattern acquisition. FIG. 12 shows an illustration of a pattern acquisition system. D is a point detector system just behind point $A_0$, which is simply a point detector or a combination of a radiation detector and a pinhole. P is a pattern. Its working surface coincides with the Y-Z plane (Z axis not shown). M is a rotational planar mirror and M1 is a stationary planar mirror. L represents a spherical lens or a plurality of lenses. The pattern plane P is illuminated by a radiation source. When pattern plane P is fed in a predetermined direction and M rotates around the X axis, the entire pattern plane is scanned. The signal from each point of the pattern, such as point B in FIG. 12, is received by the point detector system D as the scanning progresses. It is obvious that point detector system D must be adjusted out of rotational axis if the pattern plane is not positioned perpendicular to the rotational axis.

Figure 13:
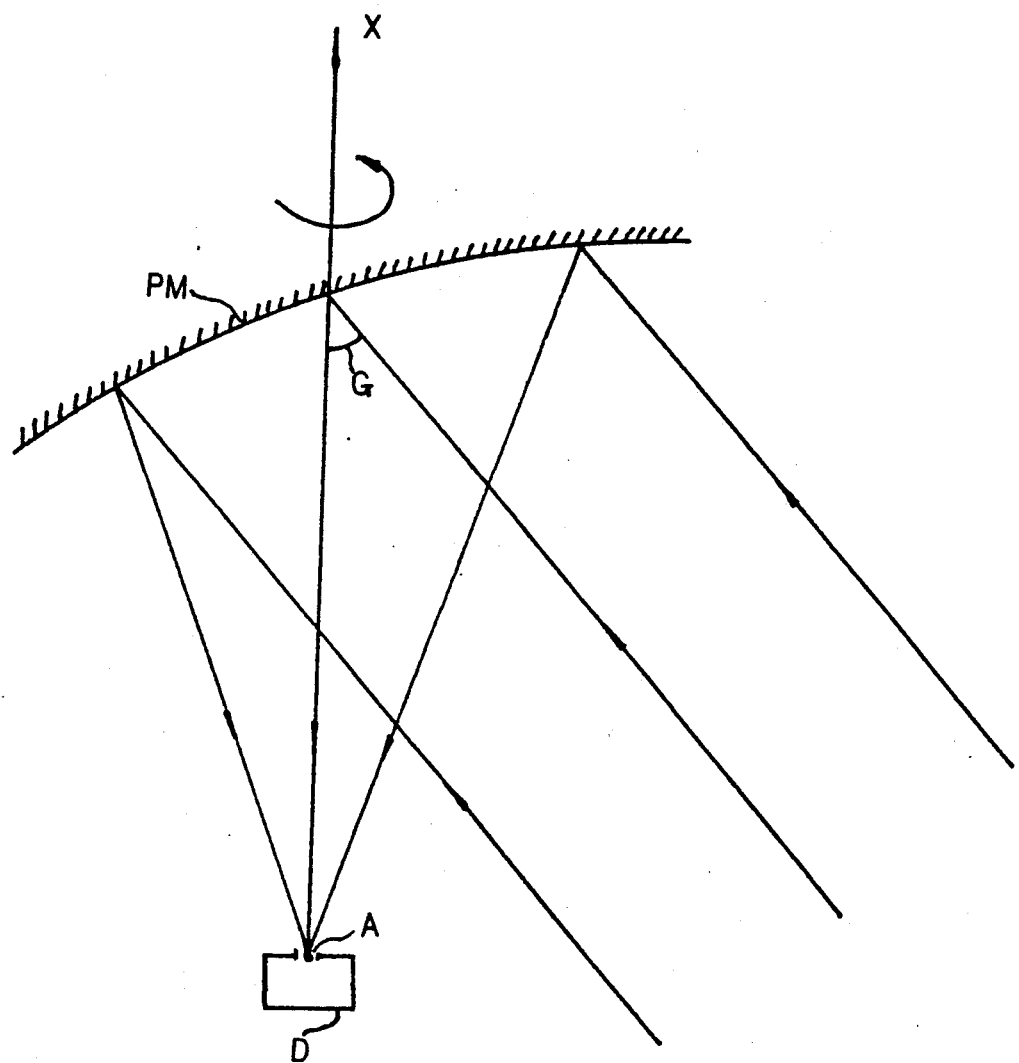
FIG. 13 shows an embodiment of an x-ray or infrared telescope in which the object is at infinity.

FIG. 13 shows another embodiment which is an x-ray telescope. The image B of point object A is moved to infinity, and PM is the parabolic mirror which focuses the parallel beam to point A where the point detector system D is positioned. When PM is rotated about the X axis, the far field signal with conic angle G is received by detector D. If this telescope is located on a flying object, the scanning of another dimension can be accomplished by the movement of the flying object. The structure of this kind of telescope is very simple and has only one optical part. Moreover, it has a large view angle G.

It is obvious that the construction in FIG. 13 can also be used in far infrared imaging as a infrared telescope.

Figure 14:
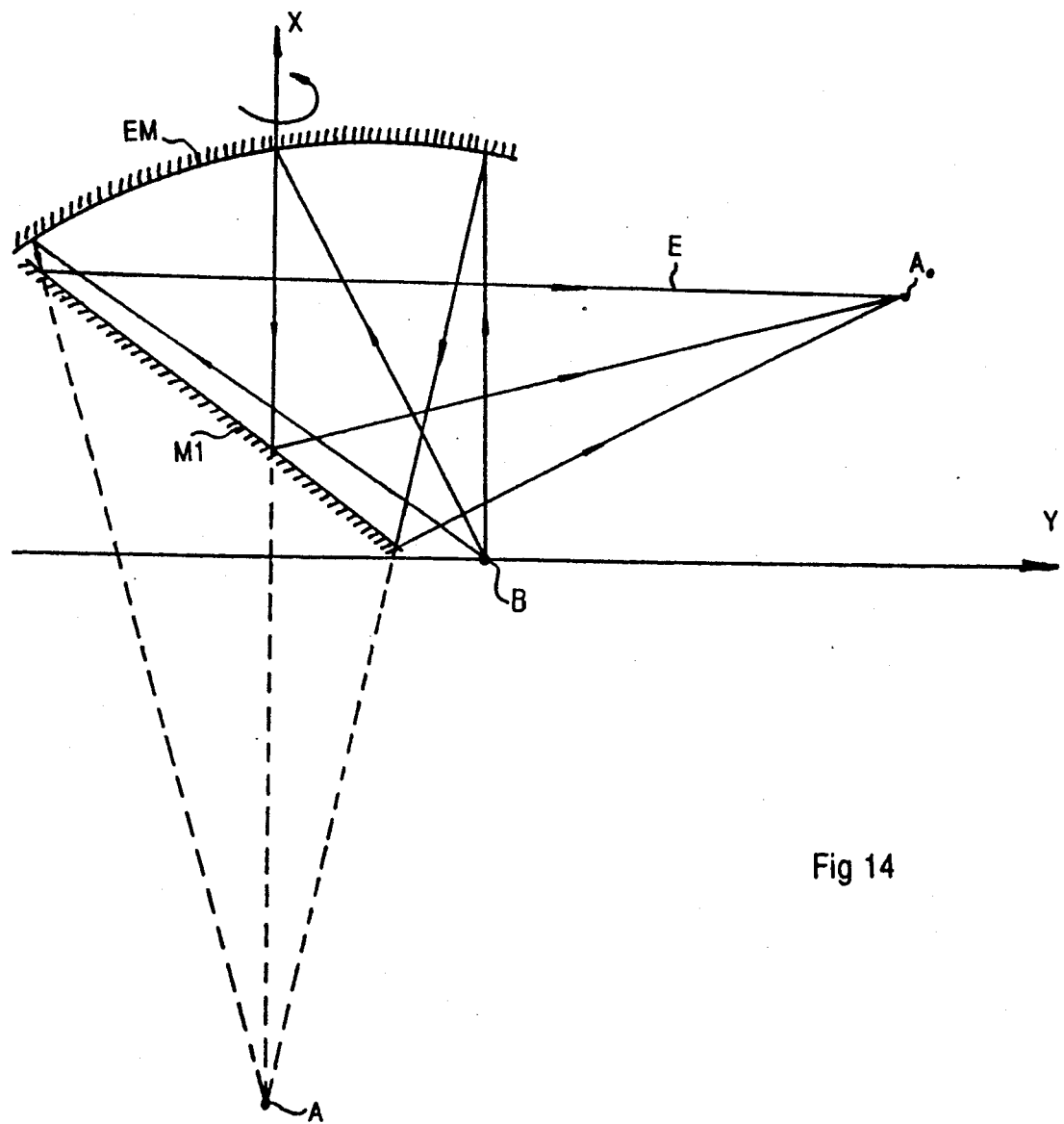
FIG. 14 shows an information reading-out and transmission system.

Similarly by using a point detector at point $A_0$ in FIG. 9, the system becomes a scanning microscope as shown in FIG. 14. The radiation propagates to the point detector from sample surface laid in the Y-Z plane which is illuminated by a radiation source. The scanning is completed when the ellipsoid mirror rotates around the X axis and the sample is fed in a predetermined direction. Here, large area scanning may not be necessary.

Figure 15:
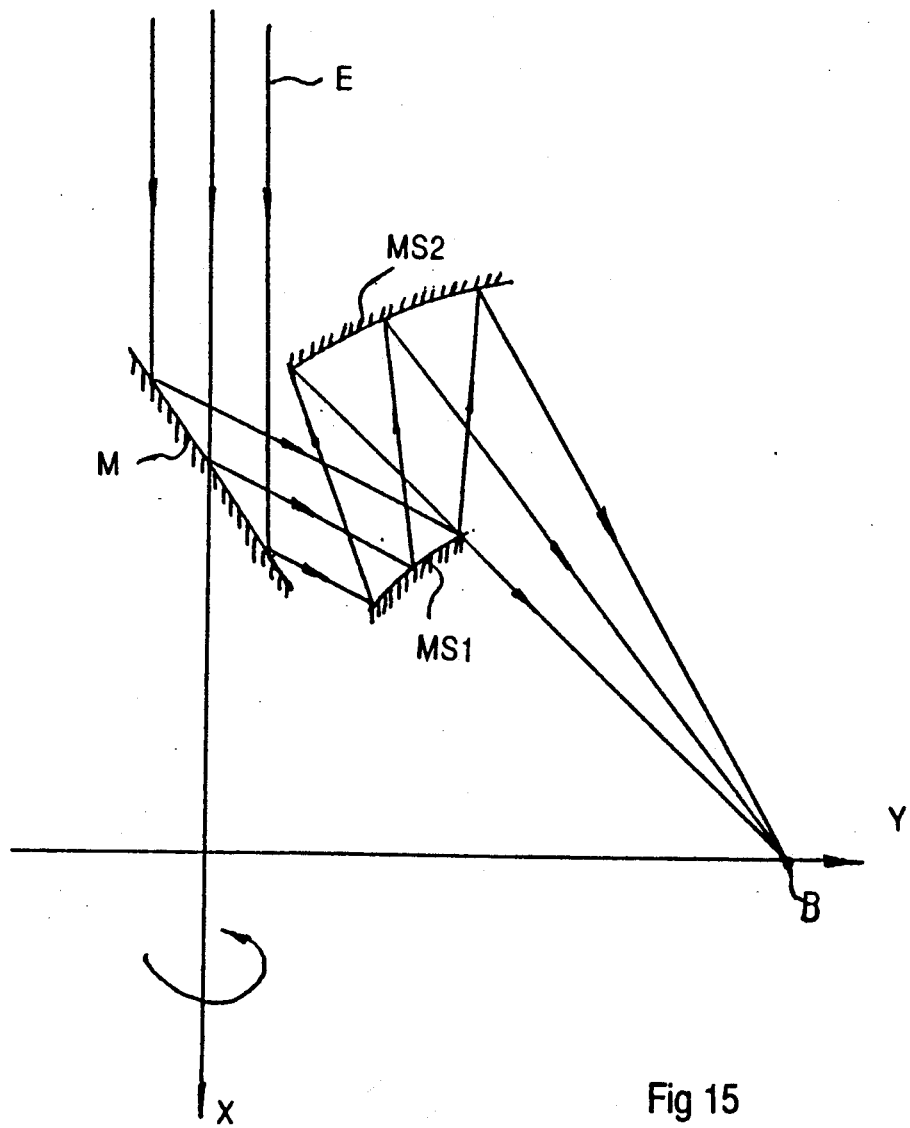
FIG. 15 shows a scanning system where the scanning is performed by the rotation of a Schwarzchild system.

In order to obtain a diffraction limited image at soft x-ray waveband, a high precision aspherical surface is required, which might be difficult to manufacture. It will be easier to use a Schwarzchild system, in which a pair of concentric spherical mirrors MS1 and MS2 are used instead of parabolic or ellipsoid surface to correct the spherical aberration. A structure using a pair of concentric spherical mirror is shown in FIG. 15. The relative position of the plane mirror M and the two spherical mirrors (MS1 and MS2) is fixed. The three mirrors are combined together to be a rotational optical system. It is obvious that the structure is also suitable for soft x-ray scanning lithography described above.

Still another application of the new scanning technique is in the reading-out and transmission of image information.

The optical card for optical memory described above in this invention can be used not only for information writing-in, but also for reading-out. Therefore the information written in using this new technique can also be read out by the same technique. It is obvious that the image information obtained by other methods can also be read out by this technique. For instance, the reading-out and transmission of satellite surveillance photography of the earth surface can be accomplished by using the structure shown in FIG. 14. It has been pointed out that the data rate of this system is as high as $10^9$ pixel/sec, better than the current techniques.

Summary, Ramifications, and Scope

Accordingly, the reader will see that the rotational optical scanning method of this invention can find many applications in various areas, such as laser direct writing lithography for production of masks or wafers for integrated circuits, high speed photography, IR imaging, image information transmission, computer generated holography, computer memory system, telescopes, microscopes, pattern acquisition, graphic-arts imaging for newspapers or for other printing materials, and so on. In addition, the rotational optical scanning method of this invention can provide many features which could not be accomplished with other scanning methods. For instance, this method can provide an UV optical scanning system with field of view larger than 20 mm and pixel dimension smaller than 0.3 μm, which is very important to the integrated circuit industry. The manufacture of integrated circuits can be achieved without using masks. Moreover, the technique provided by this invention has the additional advantages in that it can be applied to image techniques where extra-ultraviolet and soft x-ray wavebands are used, providing a resolution better than 0.3 μm or even a resolution of several hundred Angstroms, while permitting a large area to be scanned;

it can achieve very high data rate for information writing-in and reading-out, which can be over $10^9$ pixels per second;

it can provide large field of view and high resolution at the same time;

it provides a method to produce high quality computer generated hologram since it can furnish a density of at least $10^{11}$ pixels per frame;

it provides a new optical memory system which offers the high data rate required for high speed computers;

Although the description above contains many specificities, these should not be construed as limiting the scope of the invention but merely providing illustrations of some of the presently preferred embodiments of this invention. For example, different kinds of optical components can be positioned in the optical path to change the direction of radiation, to change the position of recording medium or point object or point detector, and so on; the combination of rotational scanning on a recording medium and rotational pattern acquisition can be combined to produce various devices, such as a laser printer and photocopy machine; two or more scanning devices can be combined into one by using a common rotational optical system for multi-scanning purpose, etc.

Thus the scope of the invention should be determined by the appended claims and their legal equivalents, rather than by the example given.

We claim:

1. An optical scanning device for a radiation beam, comprising:
   a point radiation source;
   a planar recording medium fed in a predetermined direction;
   a rotational optical system, wherein all the optical components are fixed to each other, said rotational optical system rotating around a rotational axis, focusing the entrant light and forming the image of said point radiation source as a single image point directly on the plane which coincides with said recording medium, whereby the image forming beam and the image point of said point radiation source rotate with the rotation of said rotational optical system and the image of said point radiation source rotationally scans said recording medium with the rotation of said optical system, wherein the scanning traces on said recording medium are circular arcs.

2. The device as defined in claim 1, wherein said recording medium is approximately perpendicular to said rotational axis.

3. The device as defined in claim 1, wherein said recording medium is approximately perpendicular to said rotational axis and said point radiation source is located approximately on said rotational axis.

4. The device as defined in claim 1, further including a stationary optical system, positioned between said point radiation source and said rotational optical system, said stationary optical system forming a image of said point radiation source, said rotational optical system further forming the image of said point radiation source directly on said recording medium.

5. The device as defined in claim 1, further including a stationary optical system, positioned between said point radiation source and said rotational optical system, said stationary optical system forming the image of said point radiation source approximately on said rotational axis and said rotational optical system further forming the image of said point radiation source directly on said recording medium, wherein said recording medium is approximately perpendicular to said rotational axis.

6. The device as defined in claim 1, further including a modulation means for modulating said point radiation source.

7. The device as defined in claim 1, wherein said point radiation source comprising a radiation source and a transformation means.

8. The device as defined in claim 1, wherein said point radiation source comprising a radiation source and a transformation means and said transformation means includes a pinhole.

9. The device as defined in claim 1, wherein said point radiation source comprising a radiation source and a transformation means and said transformation means includes an optical device for focusing said radiation source.

10. An optical scanning device for radiation beams, comprising:
    a point radiation source array;
    a planar recording medium fed in a predetermined direction;
    a rotational optical system, wherein all the optical components are fixed to each other, said rotational optical system rotating around a rotational axis, focusing the entrant light and forming the image of said point radiation source array as a single image of point array directly on the plane which coincides with said recording medium,
    wherein said recording medium is approximately perpendicular to said rotational axis, whereby the image forming beam and the image of said point radiation source array rotate with the rotation of said rotational optical system and the image of said point radiation source array rotationally scans said recording medium with the rotation of said optical system, wherein the scanning traces on said recording medium are circular arcs.

11. An optical scanning device for pattern acquisition, comprising:
    a planar pattern fed in a predetermined direction;
    a radiation source illuminating said pattern;
    a point detector system;
    a rotational optical system wherein all the optical components are fixed to each other, said rotational optical system rotating around a rotational axis, focusing the entrant light from said pattern and forming the image of said pattern on said point detector system,
    whereby the pattern acquisition is completed when the signal from each point of said pattern directly and progressively enters said rotational optical system with the rotation of said rotational optical system and reaches said detector system via the same optical path within said rotational optical system, while the beam axis from said rotational optical system to said detector system remains fixed during the scanning, wherein the scanning traces on said pattern are circular arcs.

12. The device as defined in claim 11, wherein said point detector system comprising a plurality of independent point detectors.

13. The device as defined in claim 11, wherein said pattern is approximately perpendicular to said rotational axis.

14. The device as defined in claim 11, wherein said pattern is approximately perpendicular to said rotational axis and said point detector system is located approximately on said rotational axis.

15. The device as defined in claim 11, further including a stationary optical system, positioned between said point detector system and said rotational optical system, said stationary optical system transforming the pattern image from said rotational optical system on said point detector system.

16. The device as defined in claim 11, further including a stationary optical system, positioned between said point detector system and said rotational optical system, said stationary optical system forming the image of said point detector system approximately on said rotational axis and said rotational optical system transforming the image on said pattern, wherein said pattern is approximately perpendicular to said rotational axis.

17. The device as defined in claim 11, wherein said point detector system is a point detector.

18. The device as defined in claim 11, wherein said point detector system is a combination of a transformation means and a radiation detector.

19. The device as defined in claim 11, wherein said point detector system is a combination of a transformation means and a radiation detector and said transformation means includes a pinhole.

20. The device as defined in claim 11, wherein said point detector system is a combination of a transformation means and a radiation detector and said transformation means includes an optical device for focusing radiation beam.

21. The device as defined in claim 11, wherein said planar pattern is an optical card with circular arc-like memory traces.

* * * * *